US008872543B2

(12) United States Patent
Lin et al.

(10) Patent No.: US 8,872,543 B2
(45) Date of Patent: Oct. 28, 2014

(54) CONFIGURABLE LOGIC BLOCK AND OPERATION METHOD THEREOF

(71) Applicant: Industrial Technology Research Institute, Hsinchu (TW)

(72) Inventors: Wen-Pin Lin, Kaohsiung (TW); Chih-He Lin, Yunlin County (TW); Shyh-Shyuan Sheu, Taipei (TW); Hsin-Chi Lai, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/872,168

(22) Filed: Apr. 29, 2013

(65) Prior Publication Data

US 2014/0210514 A1    Jul. 31, 2014

(30) Foreign Application Priority Data

Jan. 31, 2013 (TW) .............................. 102103805 A (51) Int. Cl.
*H03K 19/173* (2006.01)
*G06F 7/38* (2006.01)
*H03K 19/177* (2006.01)

(52) U.S. Cl.
CPC ................................ *H03K 19/1776* (2013.01)
USPC .................... 326/38; 326/40; 326/41; 326/47

(58) Field of Classification Search
None
See application file for complete search history.

(56) References Cited

U.S. PATENT DOCUMENTS

| 4,858,185 | A | 8/1989 | Kowshik et al. | |
| 5,818,316 | A | 10/1998 | Shen et al. | |
| 6,573,713 | B2 | 6/2003 | Torok et al. | |
| 7,054,190 | B2 | 5/2006 | Hanyu et al. | |
| 7,336,525 | B2 | 2/2008 | Fujita et al. | |
| 7,728,622 | B2 | 6/2010 | Chua-Eoan et al. | |
| 7,852,114 | B2 * | 12/2010 | Bertin et al. | 326/38 |
| 7,903,448 | B2 | 3/2011 | Oh et al. | |
| 8,102,018 | B2 | 1/2012 | Bertin et al. | |
| 2008/0175036 | A1 | 7/2008 | Oh et al. | |
| 2008/0238475 | A1 | 10/2008 | Chua-Eoan et al. | |
| 2011/0103134 | A1 | 5/2011 | Oh et al. | |
| 2013/0181739 | A1 * | 7/2013 | Sakimura et al. | 326/38 |

FOREIGN PATENT DOCUMENTS

TW    200632907    9/2006
TW    201214437    4/2012

OTHER PUBLICATIONS

Wen et al., "A Non-volatile Look-Up Table Design Using PCM (Phase-Change Memory) Cells", 2011 Symposium on VLSI Circuits, Jun. 2011, p. 302-p. 303.

(Continued)

*Primary Examiner* — Anh Tran
(74) *Attorney, Agent, or Firm* — Jianq Chyun IP Office (57) ABSTRACT

A configurable logic block (CLB) and an operation method of the CLB are provided. The CLB includes memory units and a selecting circuit. The memory unit includes a first resistive non-volatile memory (RNVM) element and a second RNVM element. Top electrodes (TEs) of the first and second RNVM elements are coupled to an output terminal of the memory unit. Bottom electrodes (BEs) of the first and second RNVM elements are respectively coupled to a first bias terminal and a second bias terminal of the memory unit. The selecting circuit selects one of the memory units according to an input logic value and determines an output logic value of the CLB according to an output logic value of the selected memory unit.

21 Claims, 7 Drawing Sheets

(56) References Cited

OTHER PUBLICATIONS

Matsunaga et al., "Fabrication of a Nonvolatile Full Adder Based on Logic-in-Memory Architecture Using Magnetic Tunnel Junctions", Applied Physics Express, Aug. 22, 2008, vol. 1, p. 091301-1-p. 091301-3.

Suzuki et al., "Fabrication of a Nonvolatile Lookup-Table Circuit Chip Using Magneto/Semiconductor-Hybrid Structure for an Immediate-Power-Up Field Programmable Gate Array", 2009 Symposium on VLSI Circuits, Jun. 2009, p. 80-p. 81.

Kim et al., "Field Programmable Stateful Logic Array", IEEE Transactions on Computer-Aided Design of Integrated Circuits and Systems, Dec. 2011, vol. 30, p. 1800-p. 1813.

Tanachutiwat et al., "FPGA Based on Integration of CMOS and RRAM", IEEE Transactions on Very Large Scale Integration (VLSI) Systems, Nov. 2011, vol. 19 , p. 2023-p. 2032.

Yao et al., "Magnetic Tunnel Junction-Based Spintronic Logic Units Operated by Spin Transfer Torque", IEEE Transactions on Nanotechnology, Jan. 2012, vol. 11, p. 120-p. 126.

Zhao et al., "New non-volatile logic based on spin-MTJ", p hys. stat. sol. (a), May 2008, vol. 205, p. 1373-p. 1377.

Liauw et al., "Nonvolatile 3D-FPGA With Monolithically Stacked RRAM-Based Configuration Memory", 2012 IEEE International Solid-State Circuits Conference Digest of Technical Papers, Feb. 2012, p. 406-p. 408.

Yamamoto et al., "Nonvolatile delay flip-flop using spin-transistor architecture with spin transfer torque MTJs for power-gating systems", Electronics Letters, Sep. 2011, vol. 47, p. 1-p. 2.

* cited by examiner

CONFIGURABLE LOGIC BLOCK AND OPERATION METHOD THEREOF

CROSS-REFERENCE TO RELATED APPLICATION

This application claims the priority benefit of Taiwan application serial no. 102103805, filed on Jan. 31, 2013. The entirety of the above-mentioned patent application is hereby incorporated by reference herein and made a part of this specification.

TECHNICAL FIELD

The disclosure relates to an electronic device and relates to a configurable logic block and an operation method thereof.

BACKGROUND

Miniaturization of electronic products and IC chips is an important trend in the development of semiconductor technology. Configurable integrated circuits that are currently available in the market (e.g. field programmable gate array (FPGA) or other types) have different internal connection structures and different designs of internal configurable logic block (CLB) types. Generally speaking, a CLB is equipped with a memory inside. The memory can serve as a look-up table (LUT). That is, the user may write a truth table (i.e. relationship between input and output) in the memory, so as to equip the CLB with a corresponding function (e.g. logic gate, adder, subtractor, or other functions). Because fabricating processes vary greatly between different memory types, there is difficulty in integrating system-on-a-chip (SoC), and this is a challenge to the development of embedded memory. In terms of fabricating process, for example, a flash memory element requires additional two to eight masks in comparison with a static random access memory (SRAM) element and may require new fabricating processes. Thus, the difficulty and costs of integration of SoC are increased.

The conventional CLB uses SRAM to store the LUT. Due to different contents of the LUT, the CLB may have different logic operation functions. However, when the system power is interrupted, the programming content (LUT content) stored by the SRAM will disappear. For this reason, the programming system has to rewrite the programming content from an external memory device into the SRAM in the LUT whenever the system voltage resumes. Consequently, the starting process of the CLB is complicated and the costs are increased. In addition to the above, CLB equipped with SRAM usually has higher static power consumption and dynamic power consumption.

SUMMARY

The configurable logic block of the disclosure includes a plurality of memory units and a selecting circuit. One of the memory units includes a first bias terminal, a second bias terminal, an output terminal, a first RNVM element, and a second RNVM element. Herein, when a top electrode (TE) of the first RNVM element and a top electrode (TE) of the second RNVM element are coupled to the output terminal of the memory unit, a bottom electrode (BE) of the first RNVM element and a bottom electrode (BE) of the second RNVM element are respectively coupled to the first bias terminal and the second bias terminal of the memory unit; and when the bottom electrode of the first RNVM element and the bottom electrode of the second RNVM element are coupled to the output terminal of the memory unit, the top electrode of the first RNVM element and the top electrode of the second RNVM element are respectively coupled to the first bias terminal and the second bias terminal of the memory unit. The selecting circuit selects one of the memory units according to an input logic value of the configurable logic block and determines an output logic value of the configurable logic block according to a logic value of the output terminal of the selected one of the memory units.

The operation method of the configurable logic block of the disclosure includes: providing a plurality of memory units, wherein one of the memory units includes a first bias terminal, a second bias terminal, an output terminal, a first RNVM element, and a second RNVM element; selecting one of the memory units according to an input logic value of the configurable logic block; and determining an output logic value of the configurable logic block according to a logic value of the output terminal of the selected one of the memory units. Herein, when a top electrode of the first RNVM element and a top electrode of the second RNVM element are coupled to the output terminal of the memory unit, a bottom electrode of the first RNVM element and a bottom electrode of the second RNVM element are respectively coupled to the first bias terminal and the second bias terminal of the memory unit; and when the bottom electrode of the first RNVM element and the bottom electrode of the second RNVM element are coupled to the output terminal of the memory unit, the top electrode of the first RNVM element and the top electrode of the second RNVM element are respectively coupled to the first bias terminal and the second bias terminal of the memory unit.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

The term "coupling/coupled" used in this specification (including claims) may refer to any direct or indirect connection means. For example, "a first device is coupled to a second device" should be interpreted as "the first device is directly connected to the second device" or "the first device is indirectly connected to the second device through other devices or connection means." Moreover, wherever appropriate in the drawings and embodiments, elements/components/steps with the same reference numerals represent the same or similar parts. Elements/components/steps with the same reference numerals or names in different embodiments may be cross-referenced.

The disclosure provides a configurable logic block (CLB) and an operation method thereof, wherein the configurable logic block utilizes two resistive non-volatile memory (RNVM) elements that are connected in series to store logic values of the configurable logic block, such that the configurable logic block has the characteristics of high density, low power, and information preservation.

Figure 1:
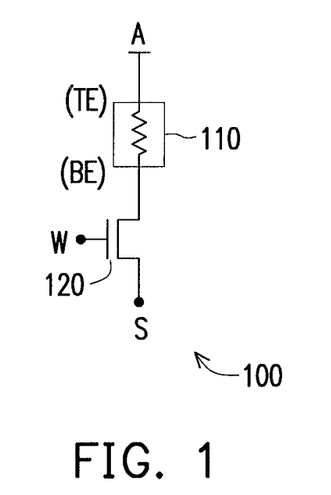
FIG. 1 is a circuit diagram illustrating a non-volatile random access memory according to an embodiment of the disclosure.

FIG. 1 is a circuit diagram illustrating a non-volatile random access memory 100 according to an embodiment of the disclosure. The non-volatile random access memory 100 includes a resistive non-volatile memory (RNVM) element 110 and a transistor 120. The transistor 120 may be embodied as a metal oxide semiconductor (MOS) transistor, a bipolar junction transistor (BJT), or other types of transistors. Take the MOS transistor as an example, a source of the transistor 120 is coupled to a voltage S and a gate of the transistor 120 is coupled to a control voltage W. Whether the transistor 120 is turned on is determined by the control voltage W.

A top electrode TE of the RNVM element 110 is coupled to a voltage A and a bottom electrode BE of the RNVM element 110 is coupled to a drain of the transistor 120. However, the RNVM element 110 may be embodied in other ways to meet the requirements of design. For instance, a basic structure of the RNVM element 110 is fabricated by disposing the bottom electrode BE, a variable resistor body, the top electrode TE in along a vertical direction of a substrate. For example, a material of the bottom electrode BE deposited on a LaAlO$_3$ (LAO) single crystal substrate may be a YBa$_2$Cu$_3$O$_7$ (YBCO) film; a material of the variable resistor body may be a Pr1-XCaXMnO$_3$ (PCMO) film of ABO$_3$ (Perovskite); and a material of the top electrode TE may be an Ag film deposited by sputtering. In addition to the aforementioned ABO$_3$ material, the known ZnSe—Ge heterostructure or a metal oxide associated with Ti, Nb, Hf, Zr, Ta, Ni, V, Zn, Sn, In, Th, Al, etc. may also be used as a material to embody the variable resistor body. As the materials or fabrication conditions of the top electrode TE, the variable resistor body, and the bottom electrode BE vary, a resistance value and a clamp voltage of the RNVM element 110 also change.

The aforementioned clamp voltage may also be deemed as a threshold voltage of the RNVM element 110. By determining a voltage between the top electrode TE and the bottom electrode BE and a direction thereof, a resistance value of the variable resistor body may be reversibly changed. That is to say, the RNVM element 110 performs a "set" operation or a "reset" operation when a voltage difference between two terminals of the RNVM element 110 is greater than the clamp voltage. For a type of the RNVM element 110 for example, when the direction of the voltage is from the top electrode TE to the bottom electrode BE, and the voltage difference between the top electrode TE and the bottom electrode BE is greater than a forward clamp voltage, the resistance value of the variable resistor body decreases. Such an operation is generally called "set." On the contrary, when the direction of the voltage is from the bottom electrode BE to the top electrode TE, and the voltage difference between the bottom electrode BE and the top electrode TE is greater than a reverse clamp voltage, the resistance value of the variable resistor body increases. Such an operation is generally called "reset." The effects of the resistive memory are achieved by reading the resistance value of the material of the variable resistor body.

A stack structure of the RNVM element 110 may be disposed above an integrated circuit, e.g. stacked on the transistor 120. Therefore, the RNVM element 110 does not increase the area of a chip.

Figure 2:
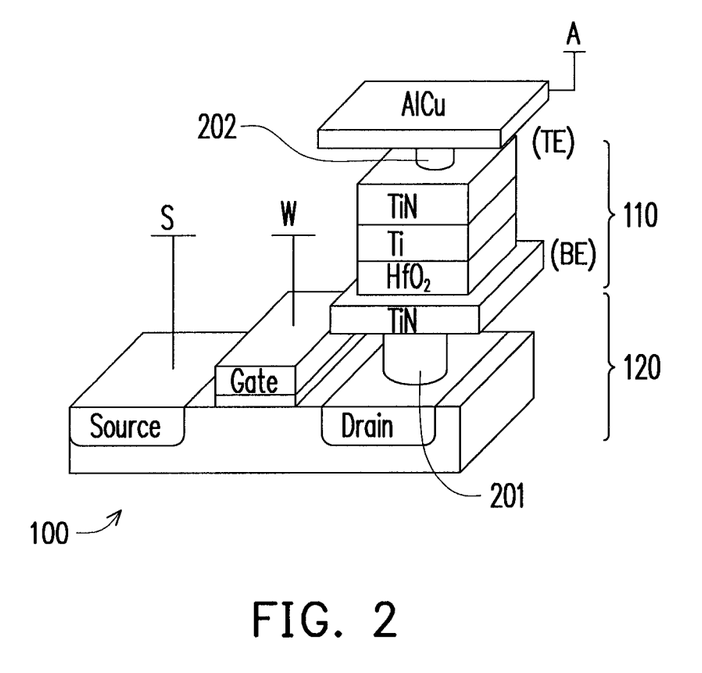
FIG. 2 is a perspective structural diagram of a resistive non-volatile memory (RNVM) element shown in FIG. 1 according to an embodiment of the disclosure.

For instance, FIG. 2 is a perspective structural diagram of the RNVM element 110 shown in FIG. 1 according to an embodiment of the disclosure. The RNVM element 110 is disposed above the substrate of the integrated circuit. The RNVM element 110 has a metal/resistive layer/metal (MIM) structure formed by stacking the bottom electrode BE, the variable resistor body, and the top electrode TE. The bottom electrode BE of the RNVM element 110 is electrically connected to the drain of the transistor 120 via a contact plug 201. In an embodiment, a material of the bottom electrode BE is TiN. In other embodiments, the bottom electrode BE includes an oxide, a nitride, or a nitrogen oxide of an element selected from manganese, iron, nickel, cobalt, titanium, copper, vanadium, and silicon, which is Ti, SiO$_2$, Si, etc., for example. In an embodiment, a HfO$_2$ thin film is plated on the bottom electrode BE by an atomic layer chemical vapor deposition method, so as to form the aforementioned variable resistor body. After finishing the variable resistor body, Ti is plated and TiN is disposed on the variable resistor body to form the top electrode TE. The top electrode TE may be electrically connected to the voltage A via a via plug 202 and a metal interconnection. A material of the metal interconnection may be Al, AlCu, other metals, or an electrically-conductive alloy.

Table 1 is an operation voltage table of the RNVM element 110 of FIG. 1 in an embodiment of the disclosure. In an initial phase of supplying power to the RNVM element 110, a non-volatile random access memory 100 performs a forming procedure (or an initializing procedure) to initialize information (resistive state) of the RNVM element 110 to an initial state (e.g. low resistive state). In the forming procedure, the transistor 120 is turned on, the voltage A is set to a high voltage level (e.g. 5V), and the voltage S is set to a low voltage level (e.g. 0V). Thus, a forming current flows from the top electrode TE of the RNVM element 110 to the bottom electrode BE. The forming current initializes the resistive state of the RNVM element 110 to the initial state (e.g. low resistive state).

TABLE 1

Operation Voltage Table of the RNVM Element 110

| Voltage | Forming | Set (low resistive state) | Reset (high resistive state) |
|---|---|---|---|
| W | 1.1 V | 1.2 V | 5 V |
| A | 5 V | 2 V | 0 |
| S | 0 | 0 | 1.5 V |

Here it is given that the low resistive state of the RNVM element 110 represents a logic value 1 and the high resistive state thereof represents a logic value 0. When a system writes the logic value 1 into the RNVM element 110, a set procedure has to be performed. In the set procedure, the transistor 120 is turned on, the voltage A is set to a high voltage level (e.g. 2V), and the voltage S is set to a low voltage level (e.g. 0V). Thus, a set current flows from the top electrode TE of the RNVM element 110 to the bottom electrode BE. Because the voltage difference (i.e. A-S) between the top electrode TE and the bottom electrode BE is greater than the forward clamp voltage of the RNVM element 110, the set current sets the resistive state of the RNVM element 110 to the low resistive state (e.g. 5 KΩ). When the system writes the logic value 0 into the RNVM element 110, a reset procedure has to be performed. In the reset procedure, the transistor 120 is turned on, the voltage A is set to a low voltage level (e.g. 0V), and the voltage S is set to a high voltage level (e.g. 1.5V). Thus, a reset current flows from the bottom electrode BE of the RNVM element 110 to the top electrode TE. Because the voltage difference (i.e. S-A) between the bottom electrode BE and the top electrode TE is greater than the reverse clamp voltage of the RNVM element 110, the reset current sets the resistive state of the RNVM element 110 to the high resistive state (greater than 100 KΩ, e.g. 1 MΩ).

The RNVM element 110 is a new non-volatile memory and has very good compatibility with a logic fabrication process. The RNVM element 110 consumes very low current when operated. The RNVM element 110 has the characteristics of low power consumption and non-volatile information. Moreover, in an embodiment, the RNVM element 110 is arranged above the MOS transistor, which does not occupy additional area and can save the area of the integrated circuit. An exemplary embodiment, in which the RNVM element 110 is used to achieve a configurable logic block (CLB), is explained below.

Figure 3:
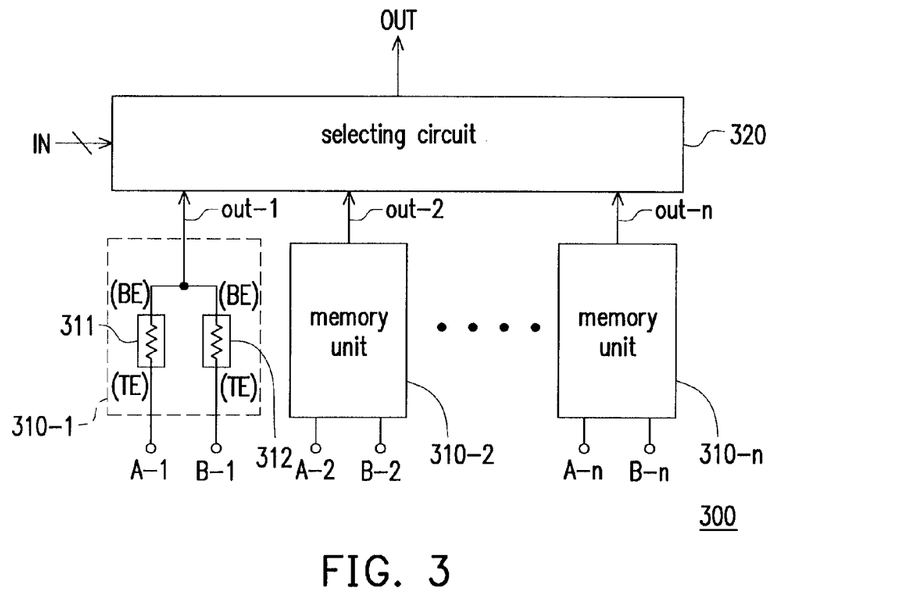
FIG. 3 is a circuit diagram illustrating a configurable logic block according to an embodiment of the disclosure.

FIG. 3 is a circuit diagram illustrating a configurable logic block 300 according to an embodiment of the disclosure. The configurable logic block 300 includes a plurality of memory units 310-1, 310-2, ... 310-n and a selecting circuit 320. The memory units 310-1~310-n respectively store and output logic values different from each other. The selecting circuit 320 selects one of the memory units 310-1~310-n according to an input logic value IN of the configurable logic block 300 and determines an output logic value OUT of the configurable logic block 300 according to an output logic value outputted by the selected one of the memory units 310-1~310-n. Therefore, the contents stored by the memory units 310-1~310-n may be made into a look-up table (LUT). The user may write a truth table (i.e. relationship between the input logic value IN and the output logic value OUT) into the memory units 310-1~310-n, such that the configurable logic block 300 has a corresponding function (e.g. logic gate, adder, subtractor, or other functions).

An exemplary embodiment of the memory unit 310-1 is provided hereinafter. The memory units 310-2~310-n may be implemented with reference to the description of the memory unit 310-1. The memory unit 310-1 includes a first bias terminal A-1, a second bias terminal B-1, an output terminal out-1, a first resistive non-volatile memory (RNVM) element 311, and a second RNVM element 312. Accordingly, the memory unit 310-2 includes a first bias terminal A-2, a second bias terminal B-2, and an output terminal out-2. The memory unit 310-n includes a first bias terminal A-n, a second bias terminal B-n, and an output terminal out-n.

For descriptions of the RNVM elements 311 and 312 shown in FIG. 3, please refer to the RNVM element 110 illustrated in FIG. 1 and FIG. 2. Referring to FIG. 3, in an embodiment, the bottom electrode BE of the first RNVM element 311 and the bottom electrode BE of the second RNVM element 312 are coupled to the output terminal out-1 of the memory unit 310-1. The top electrode TE of the first RNVM element 311 and the top electrode TE of the second RNVM element 312 are respectively coupled to the first bias terminal A-1 and the second bias terminal B-1 of the memory unit 310-1.

However, the memory unit 310-1 may be embodied in other ways and is not limited to the above. For example, in another embodiment, the top electrode TE of the first RNVM element 311 and the top electrode TE of the second RNVM element 312 may be coupled to the output terminal out-1 of the memory unit 310-1. In that case, the bottom electrode BE of the first RNVM element 311 and the bottom electrode BE of the second RNVM element 312 are respectively coupled to the first bias terminal A-1 and the second bias terminal B-1 of the memory unit 310-1.

The fabrication of the RNVM elements has very good compatibility with a logic fabrication process. The RNVM elements consume very low current when operated. Therefore, the configurable logic block 300 has the characteristics of low power and non-volatility. In comparison with the conventional random access memory (RAM) element, the RNVM element is arranged above the integrated circuit and thus does not occupy additional area of the integrated circuit. Moreover, in comparison with the conventional non-volatile memory element, the RNVM element does not require a static gate structure or an electrically erasable programmable read only memory (EEPROM) process. Thus, there is no need to add additional masks or change a gate dielectric material. Accordingly, costs of fabrication of the configurable logic block 300 are greatly reduced.

Referring to FIG. 3, after initializing the memory unit 310-1, the resistive states of the first RNVM element 311 and the second RNVM element 312 are both the initial state (e.g. both low resistive state or both high resistive state). The content stored by the memory unit 310-1 in the initial state is defined as the logic value "0," for example. The write operation performed during a writing period is explained in detail below. If the content stored by the memory unit 310-1 is to be rewritten from the logic value "0" to the logic value "1," the voltage levels of the first bias terminal A-1 and the second bias terminal B-1 are at a first write voltage Vw1 and a second write voltage Vw2 respectively during the writing period, so as to set the first RNVM element 311 and the second RNVM element 312 to different resistive states (high resistive state and low resistive state respectively). A voltage difference (i.e. |Vw1−Vw2|) between the first write voltage Vw1 and the second write voltage Vw2 is greater than a total of the clamp voltages of the first RNVM element 311 and the second RNVM element 312, so as to ensure that the resistive states of the RNVM elements change as expected during a reading period. For example, the elements 311 and 312 in different resistive states are defined as the logic value "1."

For instance, in an embodiment, the first bias terminal A-1 is coupled to 0V during the writing period, and the second bias terminal B-1 is coupled to 1.8V during the writing period. Here it is given that the initial states of the RNVM elements 311 and 312 are both high resistive states (e.g. MO). When 0V and 1.8V are respectively applied to the first bias terminal A-1 and the second bias terminal B-1, current flows from the second bias terminal B-1 to the first bias terminal A-1 through the elements 312 and 311. According to a voltage-divider theorem, a voltage of the bottom electrodes BE of the RNVM elements 311 and 312 is about 0.9V. Because a voltage difference between the top electrode TE and the bottom electrode BE is greater than the clamp voltage of the RNVM element, the first RNVM element 311 performs the reset procedure and the second RNVM element 312 performs the set procedure. Therefore, the first RNVM element 311 is maintained at high resistive state and the second RNVM element 312 is changed to low resistive state (e.g. 5 KΩ). After the resistive state of the second RNVM element 312 is changed, according to the voltage-divider theorem, the voltage of the bottom electrode BE of the elements 311 and 312 is close to 1.8V. Accordingly, the content stored by the memory unit 310-1 is rewritten from the logic value "0" to the logic value "1."

A read operation is performed during the reading period, so as to provide a first read voltage Vr1 and a second read voltage Vr2 to the first bias terminal A-1 and the second bias terminal B-1 respectively. A voltage difference (i.e. |Vr1−Vr2|) between the first read voltage Vr1 and the second read voltage Vr2 is not greater than the total of the clamp voltages of the first RNVM element 311 and the second RNVM element 312, so as to ensure that the resistive states of the RNVM elements 311 and 312 do not change by error during the reading period.

For example, in an embodiment, the first bias terminal A-1 is coupled to 0V during the reading period, and the second bias terminal B-1 is coupled to 0.6V during the reading period. If the resistive states of the first RNVM element 311 and the second RNVM element 312 are both the initial state (e.g. both low resistive state or both high resistive state), a voltage of the output terminal out-1 of the memory unit 310-1 approximates (0.6−0)/2=0.3V. Thus, the selecting circuit 320 determines an output logic value of the memory unit 310-1 is "0" according to the voltage of the output terminal out-1. If the first RNVM element 311 is in high resistive state and the second RNVM element 312 is in low resistive state, the voltage of the output terminal out-1 of the memory unit 310-1 approximates 0.6V (because the resistive value of high resistive state is much larger than the resistive value of low resistive state). Thus, the selecting circuit 320 determines the output logic value of the memory unit 310-1 is "1" according to the voltage of the output terminal out-1.

Figure 4:
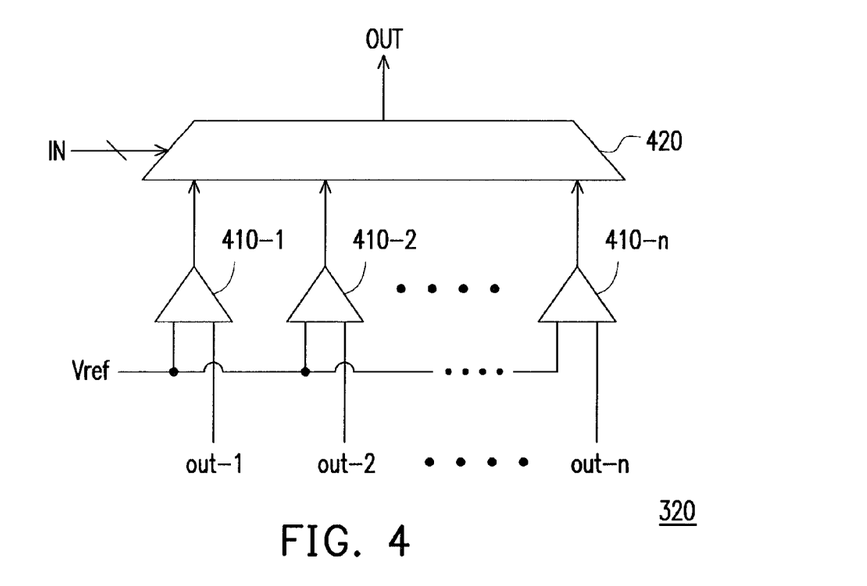
FIG. 4 is a circuit diagram illustrating a selecting circuit shown in FIG. 3 according to an embodiment of the disclosure.

FIG. 4 is a circuit diagram illustrating the selecting circuit 320 shown in FIG. 3 according to an embodiment of the disclosure. The selecting circuit 320 includes a plurality of sensing amplifiers 410-1, 410-2, ... 410-n and a multiplexer 420. First input terminals of the sensing amplifiers 410-1~410-n are respectively coupled to the output terminals out-1~out-n of the memory units 310-1~310-n of FIG. 3 on a one-to-one basis, and second input terminals of the sensing amplifiers 410-1~410-n are coupled to a reference voltage Vref. The sensing amplifiers 410-1~410-n determine the logic values of the output terminals out-1~out-n according to the reference voltage Vref. For example, in some embodiments, the reference voltage Vref may be set to 0.45V. When the voltage of the output terminal out-1 is less than 0.45V, the sensing amplifier 410-1 determines that the logic value of the output terminal out-1 is 0. When the voltage of the output terminal out-1 is greater than 0.45V, the sensing amplifier 410-1 determines that the logic value of the output terminal out-1 is 1. For the operations of the other sensing amplifiers 410-2~410-n, please refer to the description of the sensing amplifier 410-1.

The multiplexer 420 includes a plurality of input terminals that are respectively coupled to the output terminals of the sensing amplifiers 410-1~410-n on a one-to-one basis, so as to receive the logic values outputted by the memory units 310-1~310-n. A control terminal of the multiplexer 420 receives the input logic value IN of the configurable logic block 300. An output terminal of the multiplexer 420 is coupled to the output terminal of the configurable logic block 300, so as to provide the output logic value OUT. According to the control of the input logic value IN, the multiplexer 420 selects one of the output terminals of the sensing amplifiers 410-1~410-n and transmits the logic value outputted by the selected sensing amplifier among the sensing amplifiers 410-1~410-n to the output terminal of the configurable logic block 300 as the output logic value OUT.

Figure 5:
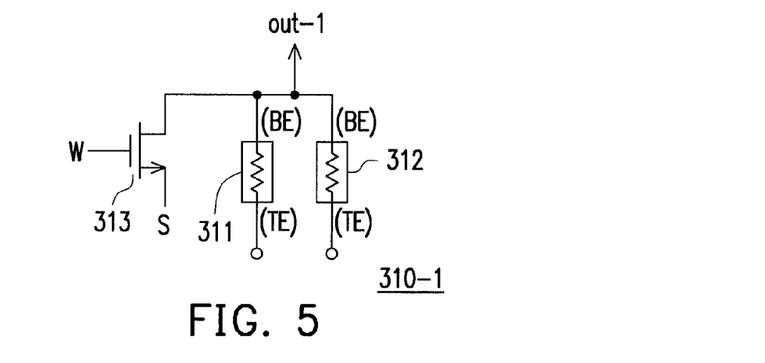
FIG. 5 is a circuit diagram illustrating a memory unit shown in FIG. 3 according to another embodiment of the disclosure.

However, the memory unit 310-1 may be embodied in other ways and is not limited to the disclosure of FIG. 3. For instance, FIG. 5 is a circuit diagram illustrating the memory unit 310-1 shown in FIG. 3 according to another embodiment of the disclosure. The memory units 310-2~310-n shown in FIG. 3 may be implemented with reference to the description related to the memory unit 310-1. Referring to FIG. 5, in an embodiment, the memory unit 310-1 includes the first bias terminal A-1, the second bias terminal B-1, the output terminal out-1, the first RNVM element 311, the second RNVM element 312, and a transistor 313. For details of the transistor 313 shown in FIG. 5, please refer to the descriptions relating to the transistor 120 of FIG. 1 and FIG. 2.

Referring to FIG. 5, the bottom electrode BE of the first RNVM element 311 and the bottom electrode BE of the second RNVM element 312 are coupled to the output terminal out-1 of the memory unit 310-1. In addition, the top electrode TE of the first RNVM element 311 and the top electrode TE of the second RNVM element 312 are respectively coupled to the first bias terminal A-1 and the second bias terminal B-1 of the memory unit 310-1. A first terminal (e.g. drain) of the transistor 313 is coupled to the bottom electrode BE of the first RNVM element 311 and the bottom electrode BE of the second RNVM element 312.

The write operation is performed during the writing period, so as to provide the first write voltage to the first bias terminal A-1, floating connect the second bias terminal B-1, provide the control voltage to the control terminal (e.g. gate) of the transistor 313, and provide the second write voltage to the second terminal (e.g. source) of the transistor 313, thereby setting the first RNVM element 311 to high resistive state (or low resistive state). Herein, a voltage difference between the first write voltage Vw1 and a second write voltage S is greater than the clamp voltage of the first RNVM element 311. Besides/alternatively, the write operation is performed during the writing period, so as to floating connect the first bias terminal A-1, provide the first write voltage to the second bias terminal B-1, provide the control voltage level to the control terminal of the transistor 313, and provide the second write voltage level to the second terminal of the transistor 313, thereby setting the second RNVM element 312 to high resistive state (or low resistive state. Herein, the voltage difference between the first write voltage and the second write voltage is greater than the clamp voltage of the second RNVM element 312.

For example, Table 2 is an operation voltage table of the memory unit 310-1 of FIG. 5 in another embodiment of the disclosure. The RNVM field of Table 2 indicates whether the RNVM element is the element 311 or 312; W represents the voltage of the control terminal of the transistor 313; and S represents the voltage of the second terminal of the transistor 313. In Table 2, "F" represents floating, "RH" represents high resistive state, and "RL" represents low resistive state.

TABLE 2

Operation Voltage Table of the Memory Unit 310-1 of FIG. 5

|  | RNVM | A-1 | B-1 | W | S |
|---|---|---|---|---|---|
| Forming | 311 | 5 V | F | 1.1 V | 0 V |
|  | 312 | F | 5 V | 1.1 V | 0 V |
| reset | 311 | 0 V | F | 5 V | 1.5 V |
|  | 312 | F | 0 V | 5 V | 1.5 V |
| set | 311 | 2 V | F | 1.2 V | 0 V |
|  | 312 | F | 2 V | 1.2 V | 0 V |
| read | 311 is RH | 0 V | 0.6 V | 0 V | 0 V |
|  | 312 is RH or RL |  |  |  |  |

For the first RNVM element 311, during the writing period, the first bias terminal A-1 is coupled to voltage 0V, the second bias terminal B-1 is floating connected, the control terminal of the transistor 313 is coupled to voltage 5V, and the second terminal of the transistor 313 is coupled to voltage 1.5V, so as to reset the first RNVM element 311 to high resistive state RH. Alternatively, during the writing period, the first bias terminal A-1 is coupled to voltage 2V, the second bias terminal B-1 is floating connected, the control terminal of the transistor 313 is coupled to voltage 1.2V, and the second terminal of the transistor 313 is coupled to voltage 0V, so as to reset the first RNVM element 311 to low resistive state RL. According to the definition of the embodiment, the resistive state of the first RNVM element 311 is set to high resistive state RH regardless of the logic value stored by the memory unit 310-1. However, in other embodiments, a relationship between the logic value stored by the memory unit 310-1 and the resistive state of the first RNVM element 311 may be determined in accordance with the actual design requirements.

For the second RNVM element 312, during the writing period, the first bias terminal A-1 is floating connected, the second bias terminal B-1 is coupled to voltage 0V, the control terminal of the transistor 313 is coupled to voltage 5V, and the second terminal of the transistor 313 is coupled to voltage 1.5V, so as to reset the second RNVM element 312 to high resistive state RH. Alternatively, during the writing period, the first bias terminal A-1 is floating connected, the second bias terminal B-1 is coupled to voltage 2V, the control terminal of the transistor 313 is coupled to voltage 1.2V, and the second terminal of the transistor 313 is coupled to voltage 0V, so as to set the second RNVM element 312 to low resistive state RL. According to the definition of the embodiment, when the logic value stored by the memory unit 310-1 is 1, the resistive state of the second RNVM element 312 is low resistive state RL; and when the logic value stored by the memory unit 310-1 is 0, the resistive state of the second RNVM element 312 is high resistive state RH. However, in other embodiments, a relationship between the logic value stored by the memory unit 310-1 and the resistive state of the second RNVM element 312 may be determined in accordance with the actual design requirements.

The read operation is performed during the reading period, so as to provide the first read voltage Vr1 and the second read voltage Vr2 to the first bias terminal A-1 and the second bias terminal B-1 respectively. Furthermore, |Vr1−Vr2| is not greater than the total of the clamp voltages of the first RNVM element 311 and the second RNVM element 312, so as to ensure that the resistive states of the RNVM elements 311 and 312 do not change by error during the reading period. As shown in Table 2 for example, during the reading period, the first bias terminal A-1 is coupled to voltage 0V, the second bias terminal B-1 is coupled to voltage 0.6V, the control terminal of the transistor 313 is coupled to voltage 0V, and the second terminal of the transistor 313 is coupled to voltage 0V. When the logic value stored by the memory unit 310-1 is 0, which means that the resistive states of the first RNVM element 311 and the second RNVM element 312 are both high resistive state RH, the voltage of the output terminal out-1 of the memory unit 310-1 approximates (0.6−0)/2=0.3V. When the logic value stored by the memory unit 310-1 is 1, which means that the first RNVM element 311 is high resistive state RH (e.g. 1 MΩ) and the second RNVM element 312 is low resistive state RL (e.g. 5 KΩ), the voltage of the output terminal out-1 of the memory unit 310-1 approximates 0.6V. Accordingly, the selecting circuit 320 determines whether the output logic value of the memory unit 310-1 is "1" or "0" according to the voltage of the output terminal out-1.

Figure 6:
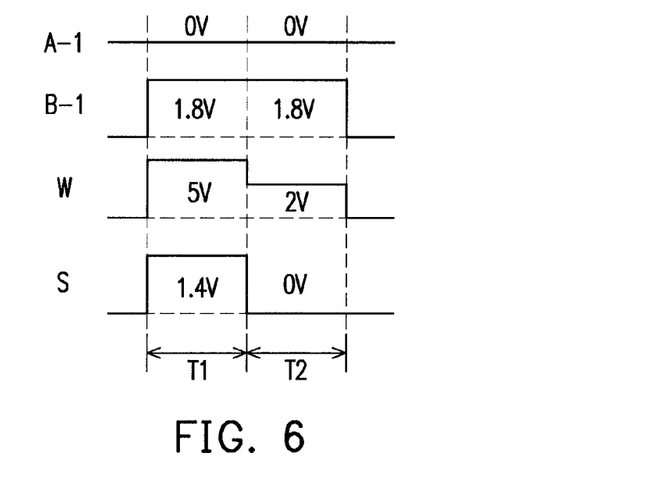
FIG. 6 is an operation voltage waveform timing diagram of a write operation performed by the memory unit of FIG. 5 according to yet another embodiment of the disclosure.

However, the operation of the memory unit 310-1 shown in FIG. 5 is not limited to the example of Table 2. For instance, FIG. 6 is an operation voltage waveform timing diagram of the write operation performed by the memory unit 310-1 of FIG. 5 according to yet another embodiment of the disclosure. Referring to FIG. 5 and FIG. 6, when writing the logic value 1 into the memory unit 310-1, the voltage level of the first bias terminal A-1 is the first write voltage (e.g. 0V), and the voltage level of the second bias terminal B-1 is the second write voltage (e.g. 1.8V) during the writing period. In a first sub-period T1 of the writing period, a voltage W of the control terminal of the transistor 313 is a first control voltage (e.g. 5V), and a level of a voltage S of the second terminal of the transistor 313 is a third write voltage (e.g. 1.4V). Because the transistor 313 is turned on, the voltage of the bottom electrodes BE of the elements 311 and 312 is 1.4V. Since the voltage difference between 0V and 1.4V is greater than the clamp voltage of the first RNVM element 311 in the first sub-period T1, the resistive state of the first RNVM element 311 is reset to high resistive state RH. In a second sub-period T2 of the writing period, a level of the voltage W of the control terminal of the transistor 313 is a second control voltage (e.g. 2V), and the level of the voltage S of the second terminal of the transistor 313 is a fourth write voltage (e.g. 0V). Because the transistor 313 is turned on, the voltage of the bottom electrodes BE of the elements 311 and 312 is 0V. Accordingly, since the voltage difference between 1.8V and 0V is greater than the clamp voltage of the second RNVM element 312 in the second sub-period T2, the resistive state of the second RNVM element 312 is set to low resistive state RL.

Figure 7:
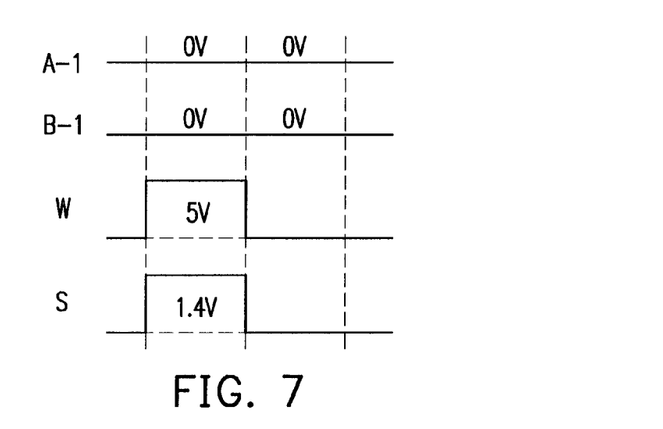
FIG. 7 is an operation voltage waveform timing diagram of a write operation performed by the memory unit of FIG. 5 according to yet another embodiment of the disclosure.

Further to the above, for instance, FIG. 7 is an operation voltage waveform timing diagram of the write operation performed by the memory unit 310-1 of FIG. 5 according to yet another embodiment of the disclosure. Referring to FIG. 5 and FIG. 7, when writing the logic value 0 into the memory unit 310-1, the voltage level of the first bias terminal A-1 and the second bias terminal B-1 is the first write voltage (e.g. 0V), the voltage W of the control terminal of the transistor 313 is the control voltage level (e.g. 5V), and the level of the voltage S of the second terminal of the transistor 313 is the second write voltage (e.g. 1.4V) during the writing period. Because the transistor 313 is turned on, the voltage of the bottom electrodes BE of the elements 311 and 312 is 1.4V. Since the voltage difference between the bottom electrode BE (1.4V) and the top electrode TE (0V) is greater than the clamp voltages of the elements 311 and 312 in the writing period, the first RNVM element 311 and the second RNVM element 312 are both reset to high resistive state RH.

Figure 8:
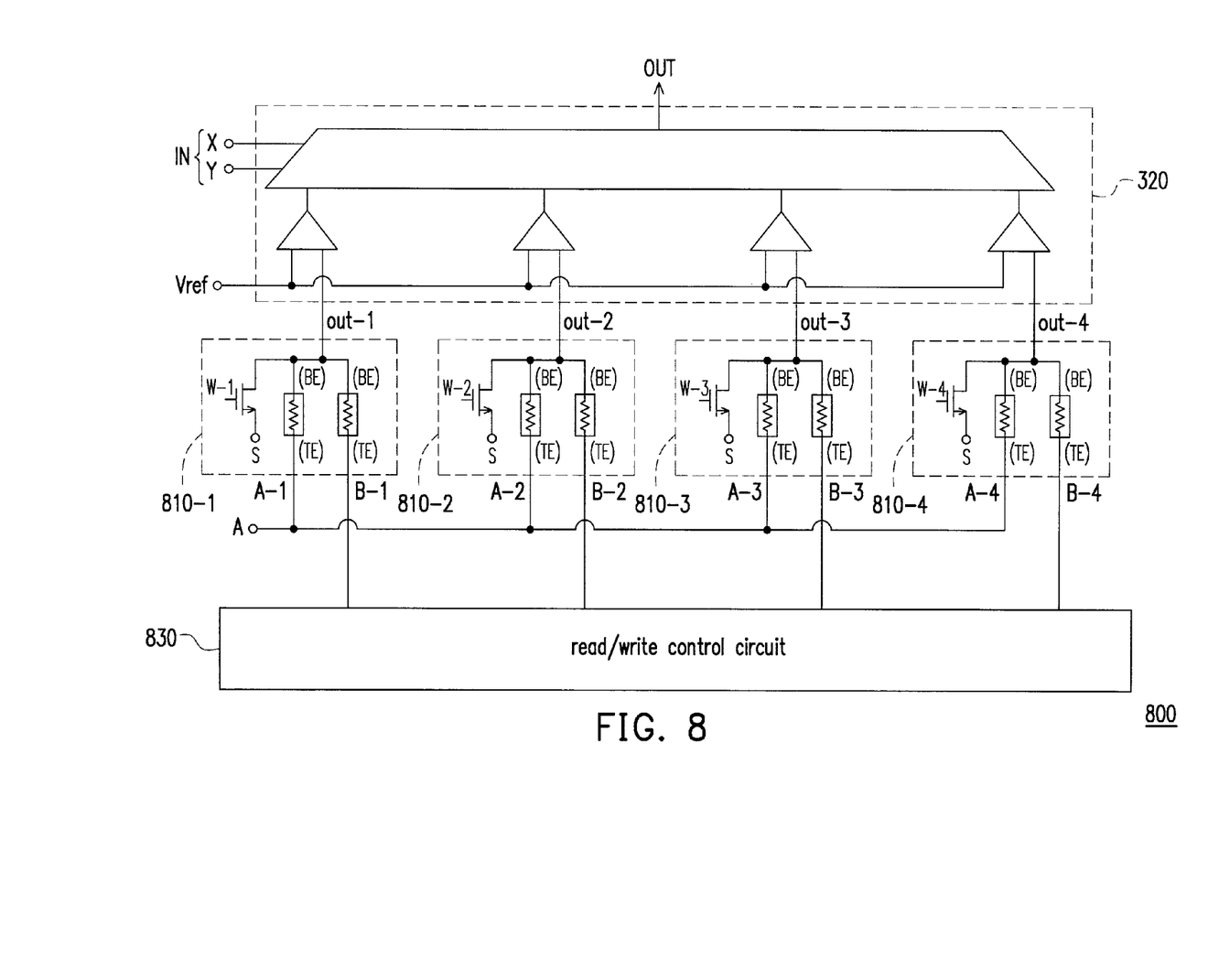
FIG. 8 is a circuit diagram illustrating a configurable logic block according to another embodiment of the disclosure.

However, the configurable logic block 300 may be embodied in other ways and is not limited to the disclosure of FIG. 3. For example, FIG. 8 is a circuit diagram illustrating a configurable logic block 800 according to another embodiment of the disclosure. For details for implementation of the configurable logic block 800 of FIG. 8, please refer to the descriptions of the configurable logic block 300 illustrated in FIG. 3. For instance, the memory units 810-1, 810-2, 810-3, and 810-4 shown in FIG. 8 may be implemented with reference to the descriptions related to the memory unit 310-1 in FIG. 3 and/or FIG. 5. A difference between this embodiment and the embodiment of FIG. 3 lies in that the embodiment of FIG. 8 further includes a read/write control circuit 830. Referring to FIG. 8, in an embodiment, the memory units 810-1~810-4 respectively include first bias terminals A-1, A-2, A-3, and A-4, which are coupled to the same node for receiving a voltage A, and second bias terminals B-1, B-2, B-3, and B-4, which are respectively coupled to a plurality of output terminals of the read/write control circuit 830 on a one-to-one basis. According to the operation method disclosed in the above embodiments (as shown in FIG. 6, FIG. 7, and/or Table 2, for example), with use of the voltage A, voltage S, voltage W-1, voltage W-2, voltage W-3, and voltage W-4, the read/write control circuit 830 provides different voltages to the second bias terminals B-1~B-4 during the writing period, so as to store a target logic value to the memory units 810-1~810-4.

For example, based on the write operation of the read/write control circuit 830 during the writing period, the first RNVM element and the second RNVM element of the memory unit 810-1 are reset to high resistive state RH, the first RNVM element and the second RNVM element of the memory unit 810-2 are reset to high resistive state RH, the first RNVM element and the second RNVM element of the memory unit 810-3 are reset to high resistive state RH, and the first RNVM element and the second RNVM element of the memory unit 810-4 are respectively reset to high resistive state RH and low resistive state RL. Accordingly, the logic value 0 is stored to the memory unit 810-1, the logic value 0 is stored to the memory unit 810-2, the logic value 0 is stored to the memory unit 810-3, and the logic value 1 is stored to the memory unit 810-4.

The read operation is performed during the reading period after the writing period, such that the voltage A provides the first read voltage Vr1 (e.g. 0V) to the first bias terminals A-1~A-4, and the read/write control circuit 830 provides the second read voltage Vr2 (e.g. 0.6V) to the second bias terminals B-1~B-4. Thus, the voltages of the output terminals out-1, out-2, out-3, and out-4 of the memory units 810-1~810-4 approximate 0.3V, 0.3V, 0.3V, and 0.6V respectively. The memory units 810-1~810-4 respectively output logic values 0, 0, 0, and 1.

The selecting circuit 320 shown in FIG. 8 may be implemented with reference to the descriptions related to the selecting circuit 320 in FIG. 3 and/or FIG. 4. Referring to FIG. 8, in an embodiment, the input logic value IN includes a logic value X and a logic value Y. When the logic values X and Y are both 0, the selecting circuit 320 selects the output of the memory unit 810-1 and determines the output logic value OUT of the configurable logic block 800 according to the output of the memory unit 810-1. When the logic values X and Y are 0 and 1, the selecting circuit 320 selects the output of the memory unit 810-2 and determines the output logic value OUT according to the output of the memory unit 810-2. When the logic values X and Y are 1 and 0, the selecting circuit 320 selects the output of the memory unit 810-3 and determines the output logic value OUT according to the output of the memory unit 810-3. When the logic values X and Y are both 1, the selecting circuit 320 selects the output of the memory unit 810-4 and determines the output logic value OUT according to the output of the memory unit 810-4.

For example, it is given that the memory units 810-1~810-4 respectively output logic values 0, 0, 0, and 1. When X and Y are both 0, the selecting circuit 320 selects the output of the memory unit 810-1 and determines the output logic value OUT to be 0. When X and Y are 0 and 1, the selecting circuit 320 selects the output of the memory unit 810-2 and determines the output logic value OUT to be 0. When the logic values X and Y are 1 and 0, the selecting circuit 320 selects the output of the memory unit 810-3 and determines the output logic value OUT to be 0. When the logic values X and Y are both 1, the selecting circuit 320 selects the output of the memory unit 810-4 and determines the output logic value OUT to be 1. According to the above, the configurable logic block 800 has an AND gate function.

Hence, in the case that the read/write control circuit 830 respectively stores logic values 1, 0, 0, and 0 to the memory units 810-1~810-4 during the writing period, the configurable logic block 800 has a NOR gate function. If the read/write control circuit 830 respectively stores logic values 0, 1, 1, and 0 to the memory units 810-1~810-4 during the writing period, the configurable logic block 800 has a XOR gate function. Thus, the configurable logic block 800 can have the function of any type of logic gate based on the content stored in the memory units 810-1~810-4.

The read/write control circuit 830 may be embodied by any means. For example, in some other embodiments, the read/write control circuit 830 includes a decoder. The decoder includes a plurality of output terminals that are respectively coupled to the output terminals of the read/write control circuit 830 on a one-to-one basis. The decoder is configured for decoding a control code provided by the system and then correspondingly outputting different voltages to the second bias terminals B-1~B-4 of the memory units 810-1~810-4, so as to control the memory units 810-1~810-4 to perform the write/read operations.

Figure 9:
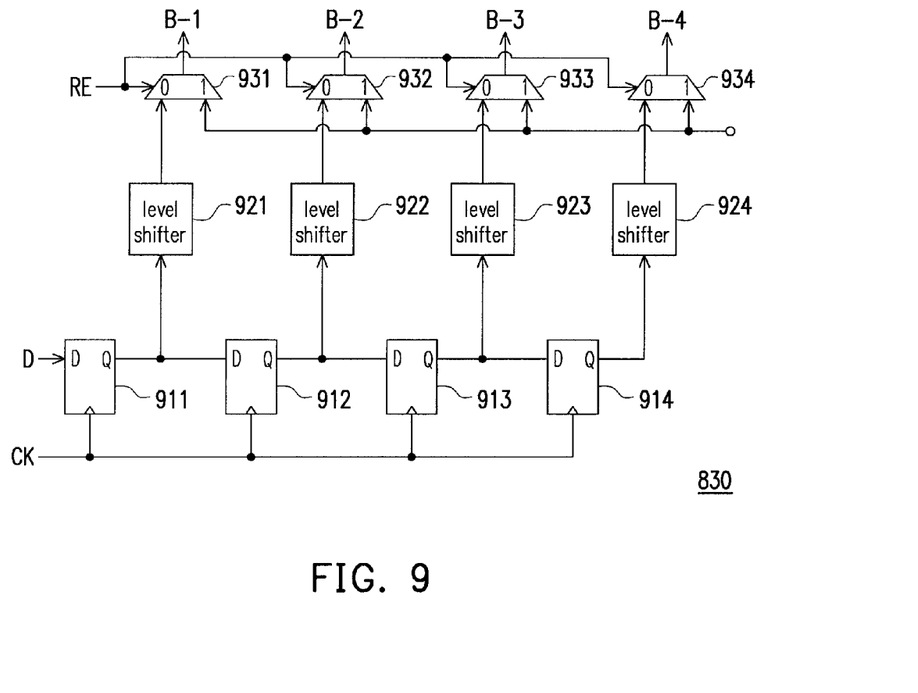
FIG. 9 is a circuit diagram illustrating a read/write control circuit shown in FIG. 8 according to another embodiment of the disclosure.

Further to the above, for instance, FIG. 9 is a circuit diagram illustrating the read/write control circuit 830 shown in FIG. 8 according to another embodiment of the disclosure. The embodiment of FIG. 3 may be implemented with reference to the description related to FIG. 9. Referring to FIG. 9, the read/write control circuit 830 includes a flip-flop 911, a flip-flop 912, a flip-flop 913, a flip-flop 914, a level shifter 921, a level shifter 922, a level shifter 923, a level shifter 924, a multiplexer 931, a multiplexer 932, a multiplexer 933, and a multiplexer 934. The flip-flops 911~914 are connected with each other in series, as shown in FIG. 9. Trigger terminals of the flip-flops 911~914 are all coupled to a clock signal CK. According to a timing of the clock signal CK and a control code D provided by a latch system of the flip-flop 911, a latch result is outputted to a data input terminal of the flip-flop 912. The flip-flops 912~914 also latch data of the output terminal of the flip-flop of the previous level according to the timing of the clock signal CK and output latch results.

The level shifters 921~924 include input terminals that are respectively coupled to the output terminals of the flip-flops 911~914 on a one-to-one basis. The level shifters 921~924 adjust output voltages of the flip-flops 911~914 and provide adjustment results to first input terminals of the multiplexers 931~934.

The first input terminals of the multiplexers 931~934 are respectively coupled to the output terminals of the level shifters 921~924 on a one-to-one basis. The read voltage Vr2 is provided to second input terminals of the multiplexers 931~934. The output terminals of the multiplexers 931~934 are respectively coupled to different output terminals of the read/write control circuit 830 on a one-to-one basis and further coupled to the second bias terminals B-1~B-4 of the memory units 810-1~810-4. The multiplexers 931-934 are controlled by a read enabling signal RE. For instance, when the read enabling signal RE is logic 1, it indicates that the configurable logic block 800 is to perform the read operation, and the multiplexers 931-934 select to provide the read voltage Vr2 to the second bias terminals B-1~B-4 of the memory units 810-1~810-4. When the read enabling signal RE is logic 0, it indicates that the configurable logic block 800 is to perform the write operation, and the multiplexers 931-934 select to provide the output voltages (representing write voltages of different logic values) of the level shifters 921~924 to the second bias terminals B-1~B-4 of the memory units 810-1~810-4 respectively.

Figure 10:
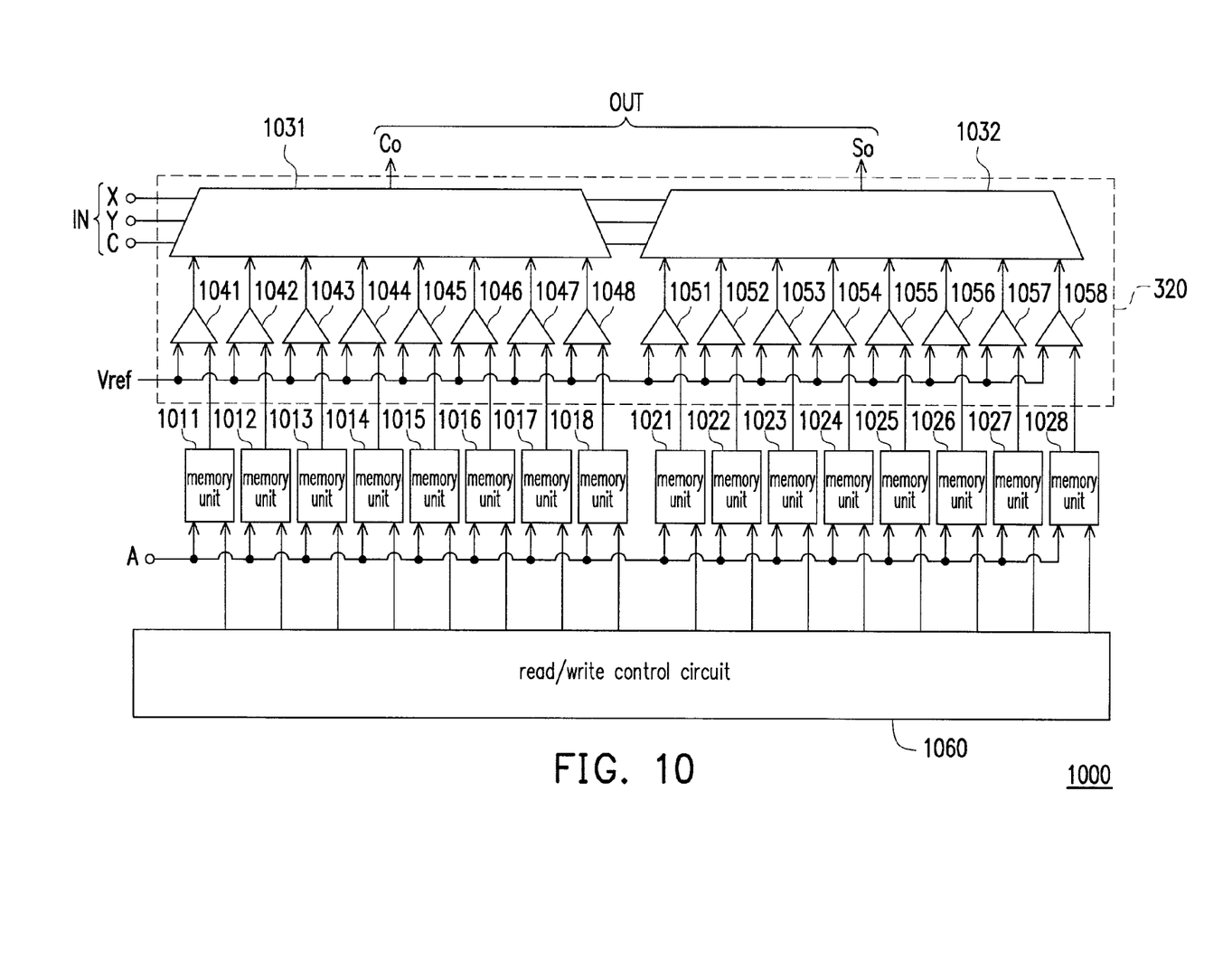
FIG. 10 is a circuit diagram illustrating a configurable logic block according to yet another embodiment of the disclosure.

FIG. 10 is a circuit diagram illustrating a configurable logic block 1000 according to yet another embodiment of the disclosure. For implementation of the configurable logic block 1000 illustrated in FIG. 10, please refer to the descriptions about the configurable logic block 300 of FIG. 3 and/or the configurable logic block 800 of FIG. 8. For example, the memory units 1011, 1012, 1013, 1014, 1015, 1016, 1017, 1018, 1021, 1022, 1023, 1024, 1025, 1026, 1027, and 1028 shown in FIG. 10 may be implemented/operated with reference to the descriptions about the memory unit 310-1 in FIG. 3 and/or FIG. 5. Moreover, a read/write control circuit 1060 of FIG. 10 may be implemented/operated with reference to the descriptions about the read/write control circuit 830 of FIG. 8.

Based on the write operation of the read/write control circuit 1060 during the writing period, the first RNVM elements and the second RNVM elements in the memory units 1011~1018 and 1021~1028 may perform reset/set operations. After finishing the write operation, based on the read operation of the read/write control circuit 1060 during the reading period, the memory units 1011~1018 and 1021~1028 may respectively output the logic values stored therein to first input terminals of sensing amplifiers 1041~1048 and 1051~1058.

A difference between this embodiment and the embodiment of FIG. 8 lies in that the selecting circuit 320 of FIG. 10 includes a first multiplexer 1031, a second multiplexer 1032, the sensing amplifier 1041, the sensing amplifier 1042, the sensing amplifier 1043, the sensing amplifier 1044, the sensing amplifier 1045, the sensing amplifier 1046, the sensing amplifier 1047, the sensing amplifier 1048, the sensing amplifier 1051, the sensing amplifier 1052, the sensing amplifier 1053, the sensing amplifier 1054, the sensing amplifier 1055, the sensing amplifier 1056, the sensing amplifier 1057, and the sensing amplifier 1058. Referring to FIG. 8, in this embodiment, the first input terminals of the sensing amplifiers 1041~1048 and 1051~1058 are respectively coupled to the output terminals of the memory units 1011~1018 and 1021~1028 on a one-to-one basis, and the second input terminals of the sensing amplifiers 1041~1048 and 1051~1058 are coupled to the reference voltage Vref. The sensing amplifiers 1041~1048 and 1051~1058 determine the logic values of the output terminals of the memory units 1011~1018 and 1021~1028 according to the reference voltage Vref and provide the logic values of the memory units 1011~1018 to the first multiplexer 1031 and provide the logic values of the memory units 1021~1028 to the second multiplexer 1032.

A plurality of input terminals of the first multiplexer 1031 are respectively coupled to the output terminals of the sensing amplifiers 1041~1048 on a one-to-one basis. A plurality of input terminals of the second multiplexer 1032 are respectively coupled to the output terminals of the sensing amplifiers 1051~1058 on a one-to-one basis. In an embodiment, the input logic value IN includes the logic value X, the logic value Y, and a logic value C; and the output logic value OUT includes a first output logic value Co and a second output logic value So. Control terminals of the first multiplexer 1031 and the second multiplexer 1032 receive the logic values X, Y, and C of the input logic value IN. Based on the control of the logic values X, Y, and C, the first multiplexer 1031 selects one of the outputs of the sensing amplifiers 1041~1048 as the first output logic value Co, and the second multiplexer 1032 selects one of the outputs of the sensing amplifiers 1051~1058 as the second output logic value So.

For example, when the logic values X, Y, and C are 0, 0, and 0, the first multiplexer 1031 selects the output of the sensing amplifier 1041 as the first output logic value Co, and the second multiplexer 1032 selects the output of the sensing amplifier 1051 as the second output logic value So. Further, for example, when the logic values X, Y, and C are 0, 0, and 1, the first multiplexer 1031 selects the output of the sensing amplifier 1042 as the first output logic value Co, and the second multiplexer 1032 selects the output of the sensing amplifier 1052 as the second output logic value So. And, the rest may be inferred in the same way.

Provided that the read/write control circuit 1060 respectively stores logic values 0, 0, 0, 1, 0, 1, 1, and 1 to the memory units 1011~1018 and respectively stores logic values 0, 1, 1, 0, 1, 0, 0, and 1 to the memory units 1021~1028 during the writing period, the configurable logic block 1000 has a full adder function. Provided that the read/write control circuit 1060 respectively stores logic values 0, 1, 1, 1, 0, 0, 0, and 1 to the memory units 1011~1018 and respectively stores logic values 0, 1, 1, 0, 1, 0, 0, and 1 to the memory units 1021~1028 during the writing period, the configurable logic block 1000 has a full subtractor function.

Figure 11:
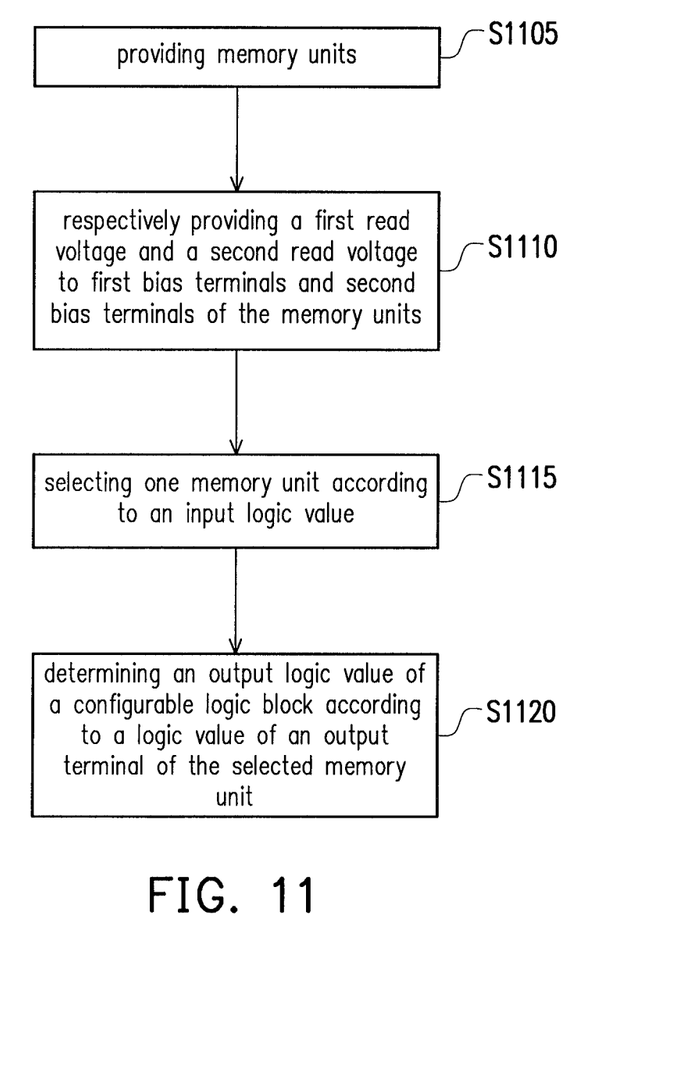
FIG. 11 illustrates an operation method of a configurable logic block according to an embodiment of the disclosure.

An operation method of the configurable logic block is explained in detail hereinafter. FIG. 11 illustrates the operation method of a configurable logic block according to an embodiment of the disclosure. Step S1105 is to provide a plurality of memory units in the configurable logic block. The memory units may be implemented/operated with reference to the descriptions about the memory unit 310-1 in FIG. 3 and/or FIG. 5. Step S1110 is to provide a first read voltage and a second read voltage to the first bias terminals and the second bias terminals of the memory units respectively during the reading period. Step S1115 is to select one of the memory units according to the input logic value IN of the configurable logic block during the reading period. Step S1120 is to determine the output logic value OUT of the configurable logic block according to a logic value of the output terminal of the selected memory unit during the reading period. Details of the write operation performed by the configurable logic block during the writing period may be found in the foregoing embodiments and thus will not be repeated hereinafter.

In conclusion of the above, the embodiments of the disclosure utilize two RNVM elements with bottom electrodes connected to store logic values. The RNVM elements operate properly even when the setting voltage is very small, and thus the power consumption of the configurable logic block is reduced. In addition, because the configurable logic block uses the RNVM elements, information is preserved non-volatilely. Moreover, according to the embodiments, the RNVM elements are arranged above the chip, which does not occupy additional area and can save the area of the chip.

It will be apparent to those skilled in the art that various modifications and variations can be made to the structure of the disclosed embodiments without departing from the scope or spirit of the disclosure. In view of the foregoing, it is intended that the disclosure covers modifications and variations of this disclosure provided they fall within the scope of the following claims and their equivalents.

What is claimed is:

1. A configurable logic block, comprising:
   a plurality of memory units, wherein one of the memory units comprises a first bias terminal, a second bias terminal, an output terminal, a first resistive non-volatile memory (RNVM) element and a second RNVM element, wherein a bottom electrode of the first RNVM element and a bottom electrode of the second RNVM element are respectively coupled to the first bias terminal and the second bias terminal of the one of the memory units when a top electrode of the first RNVM element and a top electrode of the second RNVM element are coupled to the output terminal of the one of the memory units; and the top electrode of the first RNVM element and the top electrode of the second RNVM element are respectively coupled to the first bias terminal and the second bias terminal of the one of the memory units when the bottom electrode of the first RNVM element and the bottom electrode of the second RNVM element are coupled to the output terminal of the one of the memory units; and
   a selecting circuit selecting one of the memory units according to an input logic value of the configurable logic block, and determining an output logic value of the configurable logic block according to a logic value of the output terminal of the selected one of the memory units.

2. The configurable logic block according to claim 1, wherein, during a reading period, a voltage level of the first bias terminal and a voltage level of the second bias terminal are a first read voltage and a second read voltage respectively, wherein a voltage difference between the first read voltage and the second read voltage is not greater than a total of a clamp voltage of the first RNVM element and a clamp voltage of the second RNVM element.

3. The configurable logic block according to claim 1, wherein, during a writing period, the voltage level of the first bias terminal and the voltage level of the second bias terminal are a first write voltage and a second write voltage respectively, so as to set the first RNVM element and the second RNVM element to a high resistive state and a low resistive state respectively, wherein a voltage difference between the first write voltage and the second write voltage is greater than the total of the clamp voltage of the first RNVM element and the clamp voltage of the second RNVM element.

4. The configurable logic block according to claim 1, wherein the one of the memory units further comprises:
   a transistor, a first terminal of the transistor being coupled to the bottom electrode of the first RNVM element and the bottom electrode of the second RNVM element;
   wherein the bottom electrode of the first RNVM element and the bottom electrode of the second RNVM element are coupled to the output terminal of the one of the memory units.

5. The configurable logic block according to claim 4, wherein, during a writing period, the voltage level of the first bias terminal is a first write voltage, the second bias terminal is floating connected, a voltage level of a control terminal of the transistor is a control voltage, and a voltage level of a second terminal of the transistor is a second write voltage, so as to set the first RNVM element to a high resistive state or a low resistive state; wherein a voltage difference between the first write voltage and the second write voltage is greater than the clamp voltage of the first RNVM element.

6. The configurable logic block according to claim 4, wherein, during a writing period, the first bias terminal is floating connected, the voltage level of the second bias terminal is a first write voltage, the voltage level of the control terminal of the transistor is a control voltage, and the voltage level of the second terminal of the transistor is a second write voltage, so as to set the second RNVM element to a high resistive state or a low resistive state; wherein a voltage difference between the first write voltage and the second write voltage is greater than the clamp voltage of the second RNVM element.

7. The configurable logic block according to claim 4, wherein, during a writing period, the voltage level of the first bias terminal is a first write voltage and the voltage level of the second bias terminal is a second write voltage; during a first sub-period of the writing period, the voltage level of the control terminal of the transistor is a first control voltage and the voltage level of the second terminal of the transistor is a third write voltage, so as to set the first RNVM element to a high resistive state, wherein a voltage difference between the first write voltage and the third write voltage is greater than the clamp voltage of the first RNVM element; and during a second sub-period of the writing period, the voltage level of the control terminal of the transistor is a second control voltage and the voltage level of the second terminal of the transistor is a fourth write voltage, so as to set the second RNVM element to a low resistive state, wherein a voltage difference between the second write voltage and the fourth write voltage is greater than the clamp voltage of the second RNVM element.

8. The configurable logic block according to claim 4, wherein, during a writing period, the voltage level of the first bias terminal and the second bias terminal is a first write voltage, the voltage level of the control terminal of the transistor is a control voltage, and the voltage level of the second terminal of the transistor is a second write voltage, so as to set the first RNVM element and the second RNVM element to a high resistive state; wherein a voltage difference between the first write voltage and the second write voltage is greater than the clamp voltage of the first RNVM element and greater than the clamp voltage of the second RNVM element.

9. The configurable logic block according to claim 1, wherein the selecting circuit comprises:
   a plurality of sensing amplifiers, input terminals of the sensing amplifiers being coupled to the output terminals of the memory units on a one-to-one basis; and
   a multiplexer, a plurality of input terminals of the multiplexer being respectively coupled to the output terminals of the sensing amplifiers on a one-to-one basis, a control terminal of the multiplexer receiving the input logic value, and an output terminal of the multiplexer being coupled to the output terminal of the configurable logic block to provide the output logic value.

10. The configurable logic block according to claim 1, wherein the output logic value comprises a first output logic value and a second output logic value, and the selecting circuit comprises:
   a plurality of sensing amplifiers, input terminals of the sensing amplifiers being respectively coupled to the output terminals of the memory units on a one-to-one basis;
   a first multiplexer, a plurality of input terminals of the first multiplexer being respectively coupled to the output terminals of a portion of the sensing amplifiers on a one-to-one basis, a control terminal of the first multiplexer receiving the input logic value, and an output terminal of the first multiplexer providing the first output logic value; and
   a second multiplexer, a plurality of input terminals of the second multiplexer being respectively coupled to the output terminals of another portion of the sensing amplifiers on a one-to-one basis, a control terminal of the second multiplexer receiving the input logic value, and an output terminal of the second multiplexer providing the second output logic value.

11. The configurable logic block according to claim 1, wherein the first bias terminals of the memory units are coupled to the same node.

12. The configurable logic block according to claim 11, further comprising:
a read/write control circuit, wherein the second bias terminals of the memory units are respectively coupled to a plurality of output terminals of the read/write control circuit on a one-to-one basis.

13. The configurable logic block according to claim 12, wherein the read/write control circuit comprises:
a decoder, a plurality of output terminals of the decoder being respectively coupled to the output terminals of the read/write control circuit on a one-to-one basis.

14. The configurable logic block according to claim 12, wherein the read/write control circuit comprises:
a plurality of flip-flops connected with each other in series;
a plurality of level shifters, input terminals of the level shifters being respectively coupled to output terminals of the flip-flops on a one-to-one basis; and
a plurality of multiplexers, first input terminals of the multiplexers being respectively coupled to output terminals of the level shifters on a one-to-one basis, a voltage level of second input terminals of the multiplexers being a read voltage, and output terminals of the multiplexers being respectively coupled to the output terminals of the read/write control circuit on a one-to-one basis.

15. An operation method of a configurable logic block, the operation method comprising:
providing a plurality of memory units, wherein one of the memory units comprises a first bias terminal, a second bias terminal, an output terminal, a first resistive non-volatile memory (RNVM) element and a second RNVM element, wherein a bottom electrode of the first RNVM element and a bottom electrode of the second RNVM element are respectively coupled to the first bias terminal and the second bias terminal of the one of the memory units when a top electrode of the first RNVM element and a top electrode of the second RNVM element are coupled to the output terminal of the one of the memory units; and the top electrode of the first RNVM element and the top electrode of the second RNVM element are respectively coupled to the first bias terminal and the second bias terminal of the one of the memory units when the bottom electrode of the first RNVM element and the bottom electrode of the second RNVM element are coupled to the output terminal of the one of the memory units;
providing a first read voltage and a second read voltage to the first bias terminal and the second bias terminal respectively during a reading period, wherein a voltage difference between the first read voltage and the second read voltage is not greater than a total of a clamp voltage of the first RNVM element and a clamp voltage of the second RNVM element;
selecting one of the memory units according to an input logic value of the configurable logic block during the reading period; and
determining an output logic value of the configurable logic block according to a logic value of the output terminal of the selected one of the memory units during the reading period.

16. The operation method according to claim 15, further comprising:
providing a first write voltage and a second write voltage to the first bias terminal and the second bias terminal respectively during a writing period, so as to set the first RNVM element and the second RNVM element to a high resistive state and a low resistive state respectively, wherein a voltage difference between the first write voltage and the second write voltage is greater than the total of the clamp voltage of the first RNVM element and the clamp voltage of the second RNVM element.

17. The operation method according to claim 15, wherein the one of the memory units further comprises a transistor, and a first terminal of the transistor is coupled to the bottom electrodes of the first RNVM element and the second RNVM element; and the bottom electrodes of the first RNVM element and the second RNVM element are coupled to the output terminal of the one of the memory units.

18. The operation method according to claim 17, further comprising:
providing a first write voltage to the first bias terminal during a writing period;
floating connecting the second bias terminal during the writing period;
providing a control voltage to a control terminal of the transistor during the writing period; and
providing a second write voltage to a second terminal of the transistor during the writing period to set the first RNVM element to a high resistive state or a low resistive state;
wherein a voltage difference between the first write voltage and the second write voltage is greater than the clamp voltage of the first RNVM element.

19. The operation method according to claim 17, further comprising:
floating connecting the first bias terminal during a writing period;
providing a first write voltage to the second bias terminal during the writing period;
providing a control voltage to a control terminal of the transistor during the writing period; and
providing a second write voltage to a second terminal of the transistor during the writing period to set the second RNVM element to a high resistive state or a low resistive state;
wherein a voltage difference between the first write voltage and the second write voltage is greater than the clamp voltage of the second RNVM element.

20. The operation method according to claim 17, further comprising:
providing a first write voltage to the first bias terminal during a writing period;
providing a second write voltage to the second bias terminal during the writing period;
providing a first control voltage to a control terminal of the transistor during a first sub-period of the writing period;
providing a third write voltage to a second terminal of the transistor during the first sub-period of the writing period to set the first RNVM element to a high resistive state, wherein a voltage difference between the first write voltage and the third write voltage is greater than the clamp voltage of the first RNVM element;
providing a second control voltage to the control terminal of the transistor during a second sub-period of the writing period; and
providing a fourth write voltage to the second terminal of the transistor during the second sub-period of the writing period to set the second RNVM element to a low resistive state, wherein a voltage difference between the second write voltage and the fourth write voltage is greater than the clamp voltage of the second RNVM element.

21. The operation method according to claim 17, further comprising:
provide a first write voltage to the first bias terminal and the second bias terminal during a writing period;
providing a control voltage to a control terminal of the transistor during the writing period; and
providing a second write voltage to a second terminal of the transistor during the writing period to set the first RNVM element and the second RNVM element to a high resistive state;
wherein a voltage difference between the first write voltage and the second write voltage is greater than the clamp voltage of the first RNVM element and greater than the clamp voltage of the second RNVM element.

\* \* \* \* \*